(12) United States Patent
Furukawa

(10) Patent No.: US 6,656,321 B2
(45) Date of Patent: Dec. 2, 2003

(54) LIQUID PROCESSING APPARATUS AND LIQUID PROCESSING METHOD

(75) Inventor: Takahiro Furukawa, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 111 days.

(21) Appl. No.: 09/729,047

(22) Filed: Dec. 4, 2000

(65) Prior Publication Data

US 2001/0003299 A1 Jun. 14, 2001

(30) Foreign Application Priority Data

Dec. 3, 1999 (JP) .......................................... 11-344703

(51) Int. Cl.[7] .............................................. H01L 21/306
(52) U.S. Cl. ................................................. 156/345.11
(58) Field of Search ..................................... 156/345.11

(56) References Cited

U.S. PATENT DOCUMENTS

| 4,388,140 A | * | 6/1983 | Nakazato et al. ............ 156/345 |
| 5,278,104 A | * | 1/1994 | Kodera et al. ............ 156/345.11 |
| 5,887,602 A | * | 3/1999 | Iwama ........................ 134/43 |
| 6,127,281 A | * | 10/2000 | Sakaguchi et al. .......... 438/747 |
| 6,199,567 B1 | * | 3/2001 | Kanno et al. .............. 156/345.11 |

FOREIGN PATENT DOCUMENTS

JP  10-92790  4/1998

* cited by examiner

*Primary Examiner*—Gregory Mills
*Assistant Examiner*—Sylvia R. MacArthur
(74) *Attorney, Agent, or Firm*—Morrison & Foerster LLP

(57) ABSTRACT

A liquid processing apparatus is capable of uniformly processing substrates by a liquid process. The liquid processing apparatus has a chemical liquid tank (21) containing a processing liquid for processing wafers (W) by a predetermined liquid process, a carrying device (24) provided with a wafer holder (42) capable of holding a plurality of wafers (W) to be subjected to the liquid process in a vertical position, and capable of carrying the wafers (W) between a processing position where the wafers (W) are immersed in the chemical liquid contained in the chemical liquid tank (21) and a position above the processing position, and a cover (50) for covering a space extending over the wafers (W) held on the wafer holder (42) of the carrying device (24) so that any air currents may not be substantially generated in the same space.

9 Claims, 12 Drawing Sheets

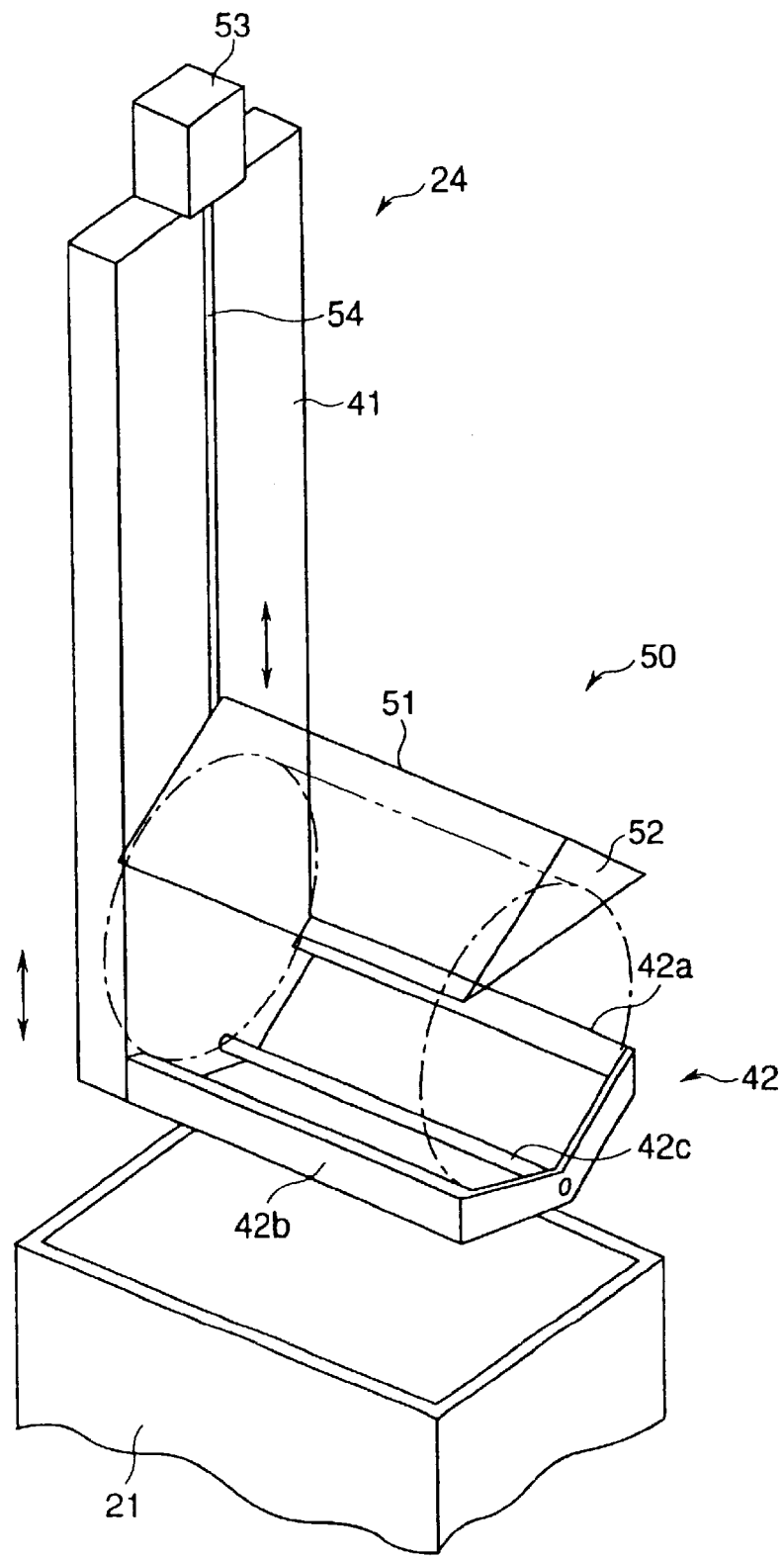
F I G. 4

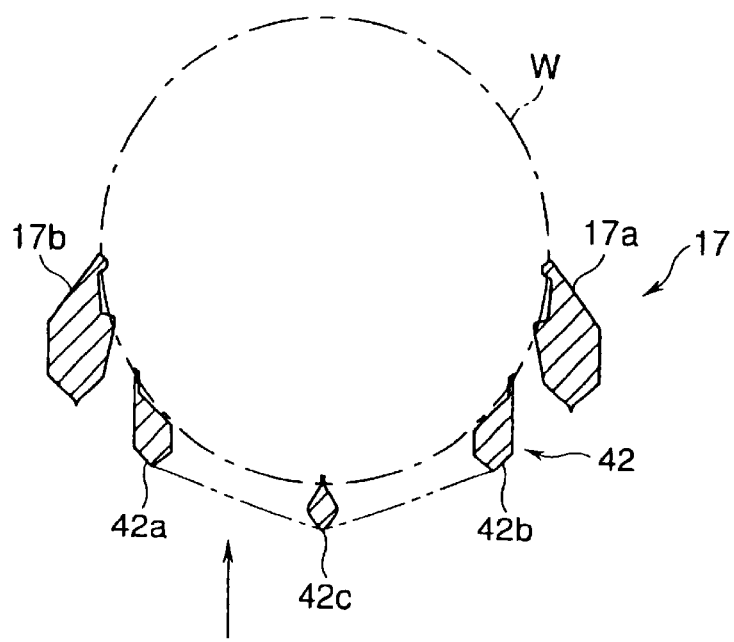
FIG. 6
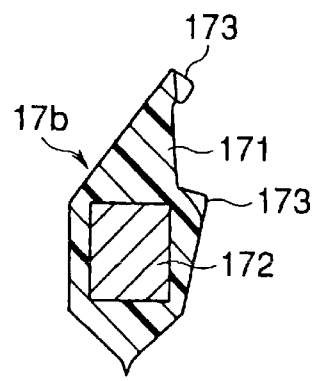 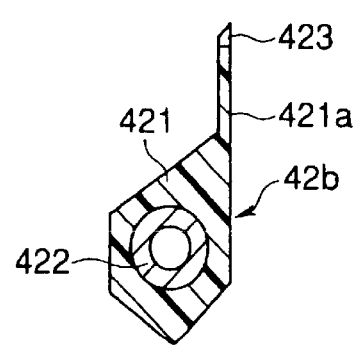 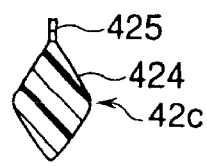
FIG. 7A    FIG. 7B    FIG. 7C

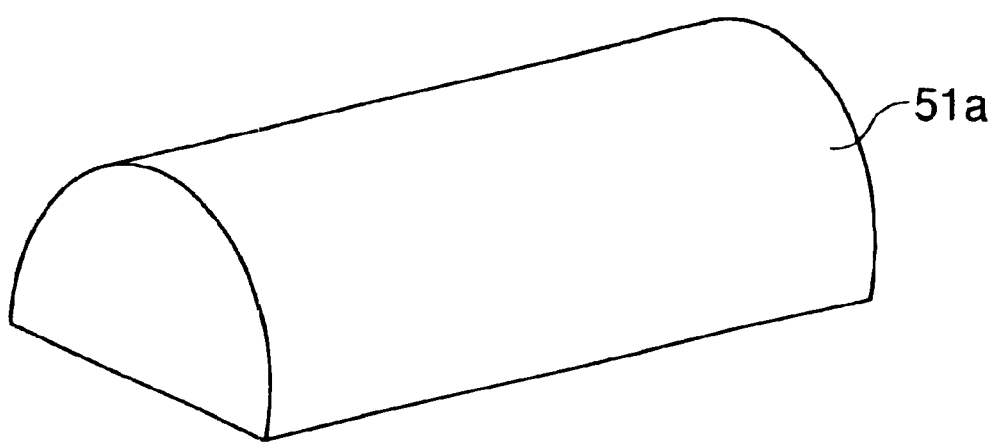
F I G. 15A
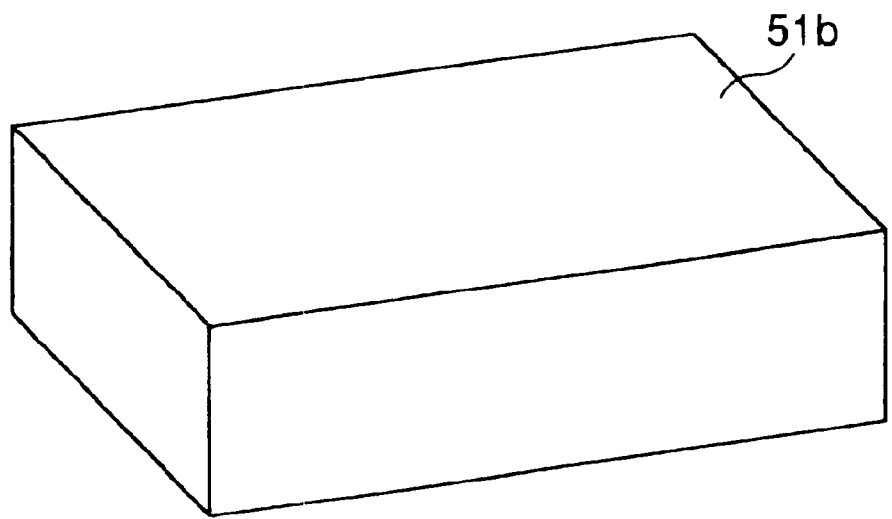
F I G. 15B

LIQUID PROCESSING APPARATUS AND LIQUID PROCESSING METHOD

BACKGROUND OF THE INVENTION

1. Field of the Invention

The present invention relates to a liquid processing apparatus for processing substrates, such as semiconductor wafers, by a predetermined liquid process and a liquid processing method to be carried out by the same.

2. Description of the Related Art

A semiconductor device fabricating process uses a liquid processing apparatus that processes semiconductor wafers (hereinafter referred to simply as "wafers"), i.e., substrates, by processing liquids, such as chemical liquids and pure water, for cleaning to remove contaminants including particles, organic contaminants and metallic impurities and for etching.

Such a liquid processing apparatus holds a plurality of wafers in a vertical position by a carrying arm, immerses the wafers in a chemical liquid, such as an etch solution, contained in a chemical liquid tank, takes out the wafers from the chemical liquid contained in the chemical liquid tank by the carrying arm, and transfers the wafers to a rinsing tank.

The liquid processing apparatus discharges particles contained in the atmosphere and a mist of the chemical liquid. Therefore, a downflow of clean air is produced in the liquid processing apparatus. It is mentioned in JP-A No. Hei 10-92790 that the clean air flows down along the wafers and it is possible that the wafers are processed irregularly when the wafers are raised into a space in which a downflow of clean air is produced after being immersed in a chemical liquid. When a hydrofluoric acid solution is used as a chemical liquid for an etching process, the hydrofluoric acid solution wetting upper portions of the wafers is dried by the downflow of clean air and the upper portions of the wafers are not etched unsatisfactorily. It is also mentioned in JP-A No. Hei 10-92790 that a cover is disposed above the wafers held by a wafer carrying means so as to screen the wafers from the downflow of clean air to avoid irregular processing due to the downflow of clean air.

Experiments conducted by the inventors of the present invention proved that the wafers are etched still irregularly even if the wafers are screened from the downflow of clean air.

SUMMARY OF THE INVENTION

The present invention has been made in view of the foregoing problem and it is therefore an object of the present invention to provide a liquid processing apparatus and a liquid processing method capable of uniformly processing substrates by a liquid process.

It is a first feature of the present invention that a liquid processing apparatus comprising: a processing bath processing a plurality of substrates by processing liquid; a substrate holding device having a substrate holding member capable of holding the plurality of substrates in a vertical position, the substrate holding device being capable of carrying the substrates between the processing bath and an upper position above the processing bath; and a cover placed in a space extending over the substrates held by the substrate holding member of the substrate holding device, the cover covering the space so that any air currents may not be substantially generated around the substrates.

The inventors of the present invention made studies of causes of irregular processing, such as irregular etching, and found that the irregular processing results not only from the effect of a downflow of clean air but also from currents produced around the upper ends of the substrates when the substrates are raised out of the processing liquid after processing the substrates in the processing liquid. The substrates cannot be screened from the currents produced around the same when the substrates are raised out of the processing liquid by simply disposing the cover for screening the substrates from a downflow of clean air, and the currents bias the processing liquid wetting the substrates, causing irregular processing. The present invention surrounds the space extending over the substrates with a cover so that air currents may not be produced in the space to prevent irregular processing by preventing the biasing of the processing liquid wetting the substrate by air currents.

It is a second feature of the present invention that the processing bath contains the processing liquid, the substrates being immersed in the processing liquid to processing substrate, and the substrate holding device carrying the substrates between a processing position where the substrates are immersed in the processing liquid in the processing bath and the upper position.

It is a third feature of the present invention that the liquid process is etching oxidized film formed on the substrate.

It is a fourth feature of the present invention that the cover has a roofing member extending circumferentially in an upper space of the substrates held by the substrate holding member and; end covering members provided on the roofing member, the end covering members being positioned in opposite sides of axial direction of a row of the substrates and in an upper space of the substrates.

It is a fifth feature of the present invention that the cover is formed in a semicylindrical shape by a combination of the roofing member and the end covering member.

It is a sixth feature of the present invention that the cover is formed in a shape of a box by a combination of the roofing member and the end covering member.

It is a seventh feature of the present invention that a lower end of the cover is on a level not higher than upper ends of the substrates.

It is an eighth feature of the present invention that the cover is supported movably upwardly and downwardly against substrates.

It is a ninth feature of the present invention that the substrate holding device is also capable of carrying the substrates between the processing bath and a position beside the processing bath.

It is a tenth feature of the present invention that the substrate holding device includes a pair of support bars capable of substantially horizontally moving toward and away from each other to hold the plurality of substrates therebetween.

It is an eleventh feature of the present invention that a liquid processing method comprising the steps of: processing substrate by processing liquid; raising the substrates out of the processing liquid; and covering a space extending over the substrates with a cover so that any air currents may not be substantially generated in the space extending over the substrates when the substrates are raised out of the processing liquid.

It is a twelfth feature of the present invention that the liquid processing method further comprising the steps of: loading or unloading the substrates on or from a carrying arm; and moving the cover to a position where the cover does not interfere with the substrates and the carrying arm when loading or unloading the substrates on or from the carrying arm.

It is a thirteenth feature of the present invention that the step of covering the space extending over the substrates with the cover includes the steps of: positioning the cover above the substrates before the substrates start emerging from the processing liquid; and raising the substrates and the cover simultaneously so that lower end of the cover is not positioned in a level higher than upper ends of the substrates.

BRIEF DESCRIPTION OF THE DRAWINGS

FIG. 4 is a perspective view of a carrying device included in the liquid processing unit shown in FIG. 3, in which wafers are held by the carrying device;

FIG. 6 is a schematic sectional view showing the carrying arm and the wafer holding device of the carrying unit at a moment when the wafers are transferred from the carrying arm to the wafer holding device of the carrying unit;

FIG. 7A is a sectional view of a chucking member of the carrying arm;

FIG. 7B is a sectional view of a side bar included in the wafer holding device;

FIG. 7C is a sectional view of a middle bar included in the wafer holding device;

FIG. 15A is a perspective view of semicylindrical cover; and

FIG. 15B is a perspective view of a box-shaped cover.

DESCRIPTION OF THE PREFERRED EMBODIMENTS

Preferred embodiments of the present invention will be described hereinafter with reference to the accompanying drawings. The present invention will be described as applied to a batch type liquid processing apparatus that continuously carries out operations for carrying in wafers, processing the wafers by a liquid, drying the processed wafers and carrying out the dried wafers.

Figure 1:
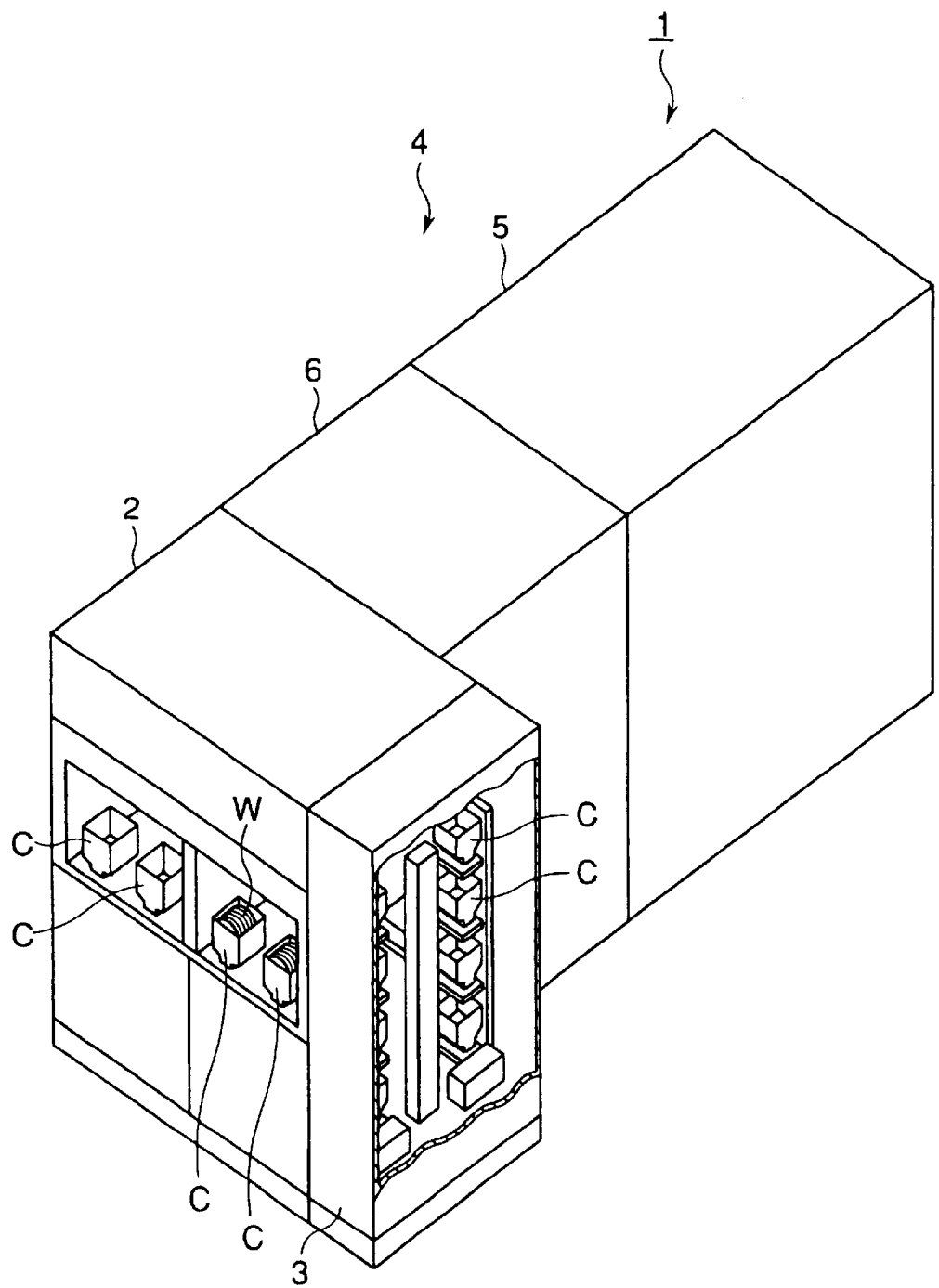
FIG. 1 is a perspective view of a liquid processing apparatus in a first embodiment according to the present invention.
Figure 2:
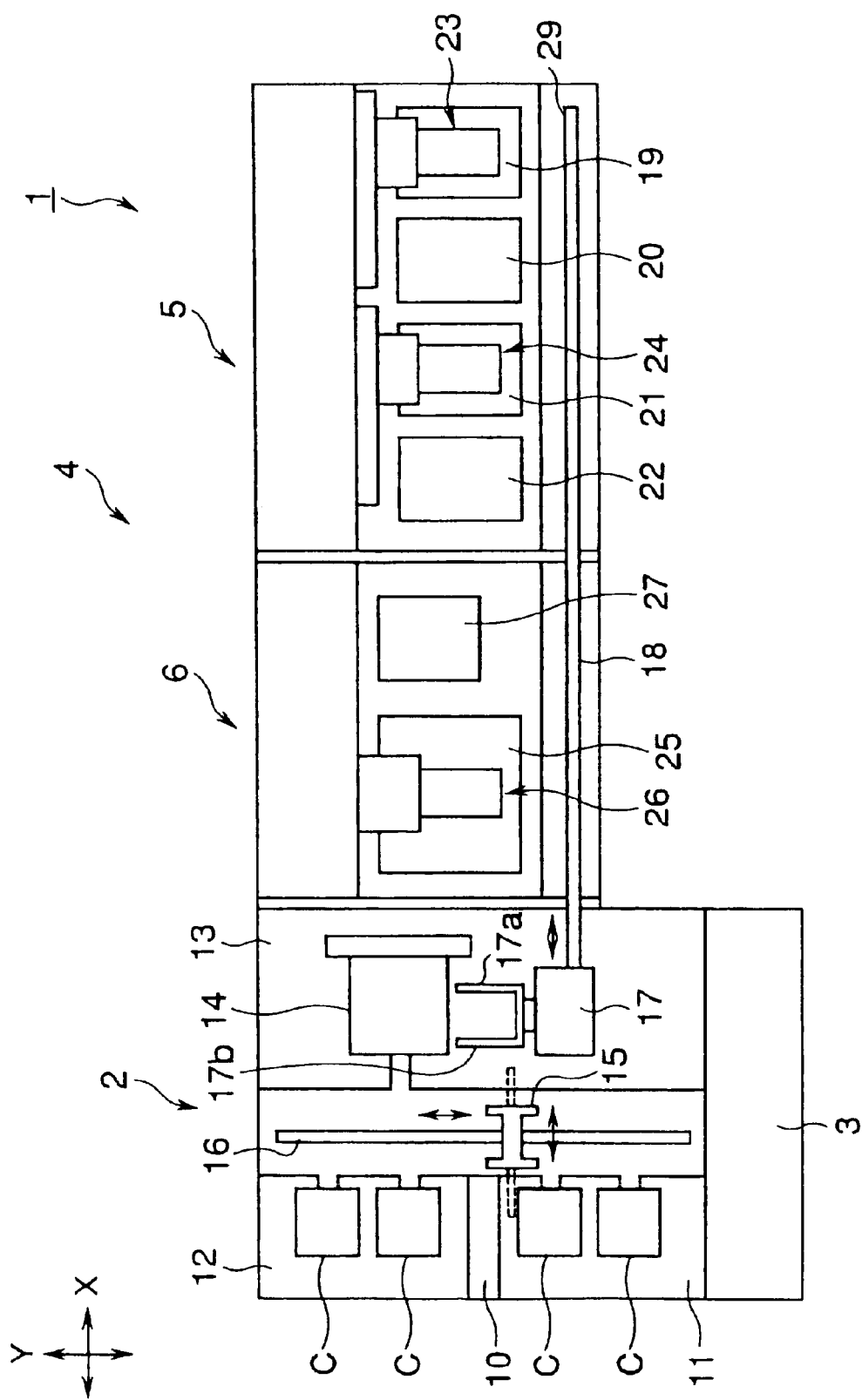
FIG. 2 is a plan view of the liquid processing apparatus shown in FIG. 1.

Referring to FIG. 1 showing a liquid processing apparatus 1 in a first embodiment according to the present invention in a perspective view and FIG. 2 showing the liquid processing apparatus 1 shown in FIG. 1 in a plan view, the liquid processing apparatus 1 has a delivery station 2 where carriers C containing wafers W are received and sent out, and wafers W are taken out of and put in the carriers C, a carrier storage station where carriers C are stored and a processing and drying station where wafers W are subjected to liquid process and drying. A liquid processing unit 5 and a drying unit 6 are installed in the processing and drying station 4.

The delivery station 2 has a receiving stage 11 capable of supporting two carriers C delivered thereto at one end thereof far from the processing and drying station 4 and a delivery stage 12 capable of supporting two carriers C containing processed wafers W. The receiving stage 11 and the delivery stage 12 are separated from each other by a partition wall 10. The delivery station 2 has a stage 13 on the other side thereof near the processing and drying station 4. A wafer arranging device 14 is installed on the stage 13. A moving table 15 is movable along a guide 16 extended in parallel to Y-directions in which carriers C are arranged. The moving table 15 is movable also in X-directions perpendicular to the Y-directions, and Z-directions, i.e., vertical directions. The moving table 15 carries a carrier C from the receiving stage 11 to a position on the stage 13 corresponding to the wafer arranging device 14, and from the position on the stage 13 corresponding to the wafer arranging device 14 to the delivery stage 12. The wafer arranging device 14 arranges wafers W at pitches equal to half the pitches at which the wafers W are arranged in a carrier C to arrange all the wafers W contained in two carriers C in a row. For example, when each carrier C contains twenty-six wafers W, the wafer arranging device 14 arranges fifty-two wafers W in a row.

The carrier storage station 3 holds temporarily empty carriers C from which wafers W to be processed have been taken out for processing and empty carriers C for receiving processed wafers W Carriers C are stored on vertically arranged shelves in the carrier storage station 3. A carrier moving mechanism is installed in the carrier storage station 3 to take out a desired carrier C and to place a carrier C at a desired position.

As mentioned above, the processing and drying station 4 has the liquid processing unit 5 and the drying unit 6. The drying unit 6 and the liquid processing unit 5 are arranged in that order from the side of the delivery station 2. The processing and drying station 4 is provided with a carrying arm 17 that travels along a guide 29 extended along the length of the processing and drying station 4. A plurality of wafers, for example fifty-two wafers, are transferred between the carrying arm 17 and the wafer arranging device 14 at a transfer position beside the wafer arranging device 14. The carrying arm 17 carries wafers W from the transfer position to the liquid processing unit 5 and from the liquid processing unit 5 to the drying unit 6. The carrying arm 17 is provided with two support bars and 17a and 17b.

Figure 3:
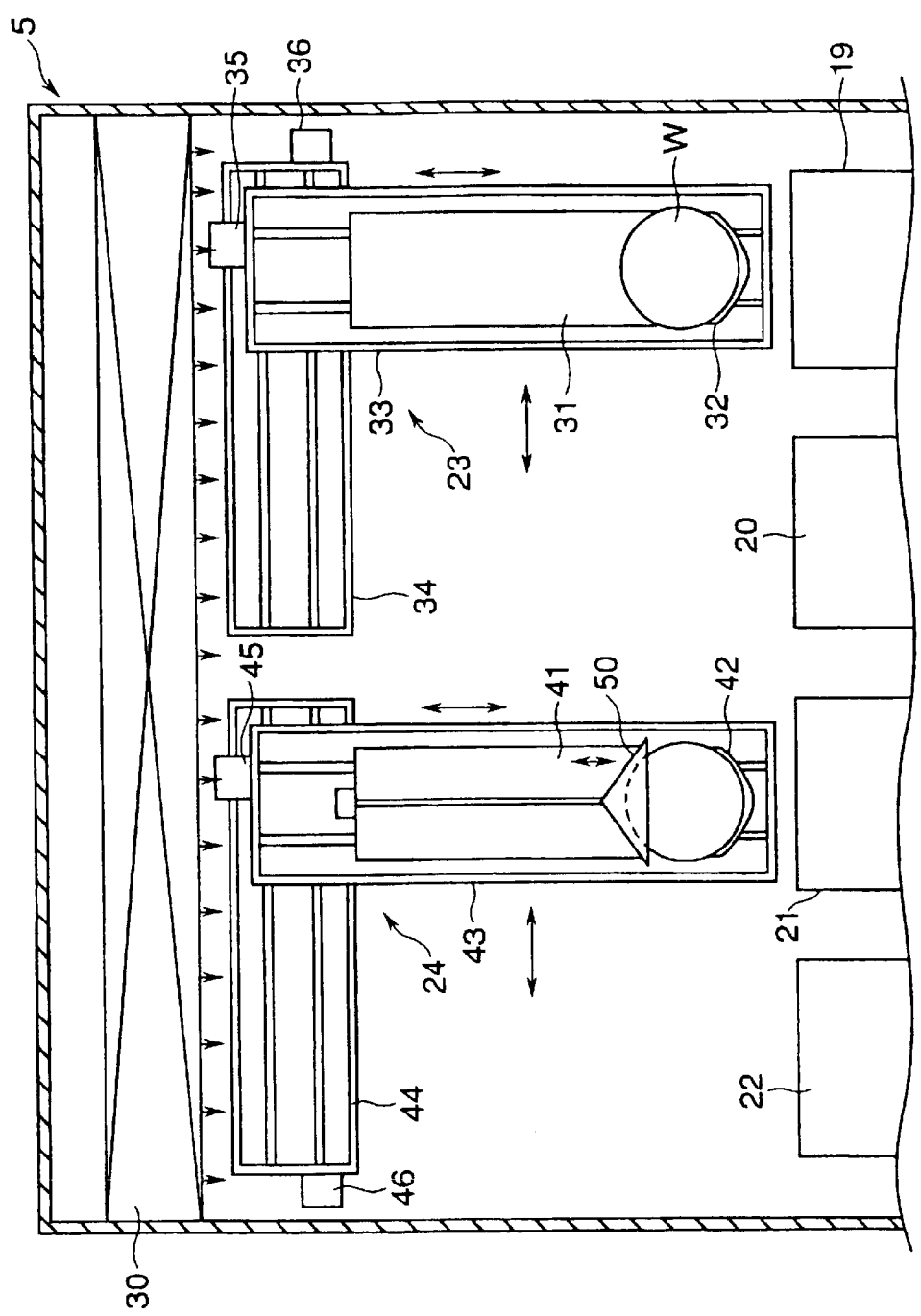
FIG. 3 is a sectional view of a liquid processing unit included in the liquid processing system shown in FIG. 1.

Referring to FIG. 3, the liquid processing unit 5 has a first chemical liquid tank 19, a first rinsing tank 20, a second chemical liquid tank 21 and a second rinsing tank 22, which are arranged in that order. The liquid processing unit 5 is provided with a first carrying device 23 for carrying wafers W between the first chemical liquid tank 19 and the first rinsing tank 20, and a second carrying device 24 for carrying wafers W between the second chemical liquid tank 21 and the second rinsing tank 22. A chemical liquid for removing deposits including particles from wafers, such as an ammonia water, is contained in the first chemical liquid tank 19. An etch solution capable of etching an oxide film formed on the surfaces of wafers W, such as a dilute hydrofluoric acid solution, is contained in the second chemical liquid tank 21. The etch solution may be any suitable one other than a dilute hydrofluoric acid solution, such as a mixture of a hydrofluoric acid solution and an ammonium fluoride solution.

As shown in FIG. 3, a filter 30 is disposed in an upper region of the liquid processing unit 5. Clean air filtered by the filter 30 is supplied into the liquid processing unit 5 in a downflow.

As shown in FIG. 3, the first carrying device 23 includes a wafer holding unit 31 having a wafer holder 32, a vertical moving mechanism 33 for vertically moving the wafer holding unit 31, and a horizontal moving mechanism 34 for horizontally moving the vertical moving mechanism 33. The vertical moving mechanism 33 and the horizontal moving mechanism 34 are provided with ball screws and motors 35 and 36 for driving the ball screws, respectively. A plurality of wafers W held by the wafer holder 32 of the wafer holding unit 31 can be moved into and moved out of the first chemical liquid tank 19 and the first rinsing tank 20 by the operations of the vertical moving mechanism 33 and the horizontal moving mechanism 34.

The second carrying device 24 is similar in construction to the first carrying device 23. The second carrying device 24 includes a wafer holding unit 41 having a wafer holder 42, a vertical moving mechanism 43 for vertically moving the wafer holding unit 41, and a horizontal moving mechanism 44 for horizontally moving the vertical moving mechanism 43. The vertical moving mechanism 43 and the horizontal moving mechanism 44 are provided with ball screws and motors 45 and 46 for driving the ball screws, respectively. A plurality of wafers W held by the wafer holder 42 of the wafer holding unit 41 can be moved into and moved out of the second chemical liquid tank 21 and the second rinsing tank 22 by the operations of the vertical moving mechanism 43 and the horizontal moving mechanism 44. As shown in FIG. 4, the second carrying device 24 has a cover 50 capable of covering a space extending over the wafers W held by the wafer holder 42. The cover 50 has a roof-shaped roofing member 51 extending in the direction of arrangement of the wafers W on the wafer holder 42, and an end covering members 52 attached to the roofing member 51 so as to cover one longitudinal end of the roofing member 51. The open base end of the roofing member 51 is covered with the wafer holding unit 41. The wafer holding unit 41 serves also as a covering member. A ball screw built in the wafer holding unit 41 is driven by a motor 53 placed on the upper end of the wafer holding unit 41 to move the cover 50 vertically. The wafers W held by the wafer holder 42 is raised out of the second chemical liquid tank 21 after being immersed in the etch solution, such as a dilute hydrofluoric acid solution, contained in the second chemical liquid tank 21, the cover 50 is placed so as to cover a space extending over the wafers W to prevent the generation of air currents substantially in the space. In view of surely preventing the generation of air currents in the space extending over the wafers W, it is preferable that the lower end of the cover 50 is on a level not higher than that of the upper ends of the wafers W. In FIG. 4, indicated at 54 is a groove along which a support member supporting the cover 50 moves. As shown in FIG. 4, the wafer holder 42 has three support bars 42a, 42b and 42c to support the wafers W thereon. The wafer holder 32 of the first carrying device 23 is the same in construction as the wafer holder 42.

Figure 5:
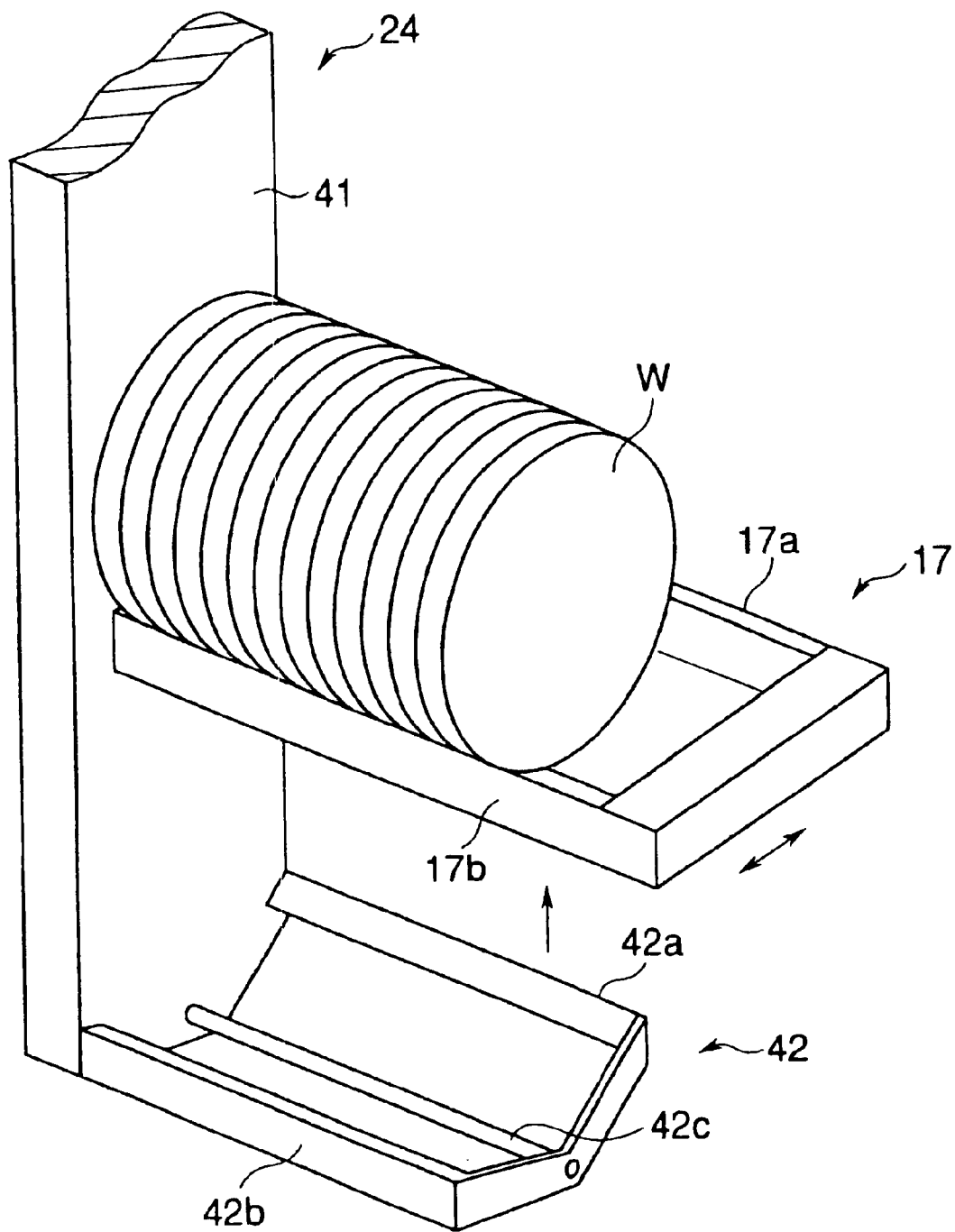
FIG. 5 is a fragmentary perspective view of the carrying device of assistance in explaining a process of transferring wafers from a carrying arm to a wafer holding device of a carrying unit.

Wafers W are transferred between the wafer holder 32 of the first carrying device 23 and the carrying arm 17 and between the wafer holder 42 of the second carrying device 24 and the carrying arm 17, by vertically moving the wafer holding units 31 and 41, respectively. Operation for transferring wafers W will be described in terms of the operation of the second carrying device 24 by way of example with reference to FIGS. 5 and 6. The carrying arm 17 moves only horizontally along the guide member 29 and is unable to move vertically. The wafer holder 42 is placed on a level below the level of the carrying arm 17, the carrying arm 17 holding a plurality of wafers W on the support bars 17a and 17b is located directly above the wafer holder 42, and then the wafer holding unit is raised. The overall width of the wafer holder 42 is smaller than the width of a space between the support bars 17a and 17b. Therefore, the wafer W can be transferred from the carrying arm 17 to and held on the wafer holder 42 by raising the wafer holding unit 41 across the space between the support bars 17a and 17b after the wafers W have been seated on the wafer holder 42. When transferring the wafers W from the wafer holder 42 to the carrying arm 17, the foregoing steps are reversed; that is, the wafer holding unit 41 is lowered with the wafers W held on the wafer holder 42 so that the wafer holder 42 moves down across the space between the support bars 17a and 17b of the carrying arm 17.

Referring to FIG. 7A, the support bar 17b of the carrying arm 17 has a body 171 of poly(ether ether ketone) (PEEK) and a core rod 172 of a stainless steel having a rectangular cross section and longitudinally extended through the body 171. The body 171 has two wafer support portions 173. The support bar 17a is the same in construction as the support bar 17b. As shown in FIG. 7B, the support bar 42b of the wafer holder 42 has a body 421 of PEEK and a tubular core member 422 of a stainless steel longitudinally extended through the body 421. A ridge 421a extends upward from the body 421 and has a wafer support portion 423 in its extremity. The support bar 42a and the support bars of the wafer holder 32 of the first carrying device 23 are the same in construction as the support bar 42b. As shown in FIG. 7C, the support bar 42c has a body 424 of PEEK and a wafer support portion 425 formed at the extremity of the body 424. The support bars 17a and 17b of the carrying arm 17, and the support bars 42a and 42b of the wafer holder 42 have the stainless steel core members. Therefore, the support bars 17a and 17b of the carrying arm 17, and the support bars 42a and 42b of the wafer holder 42 have a high strength and can be formed in small dimensions so that those members have small portions that come into contact with wafers W.

Figure 8:
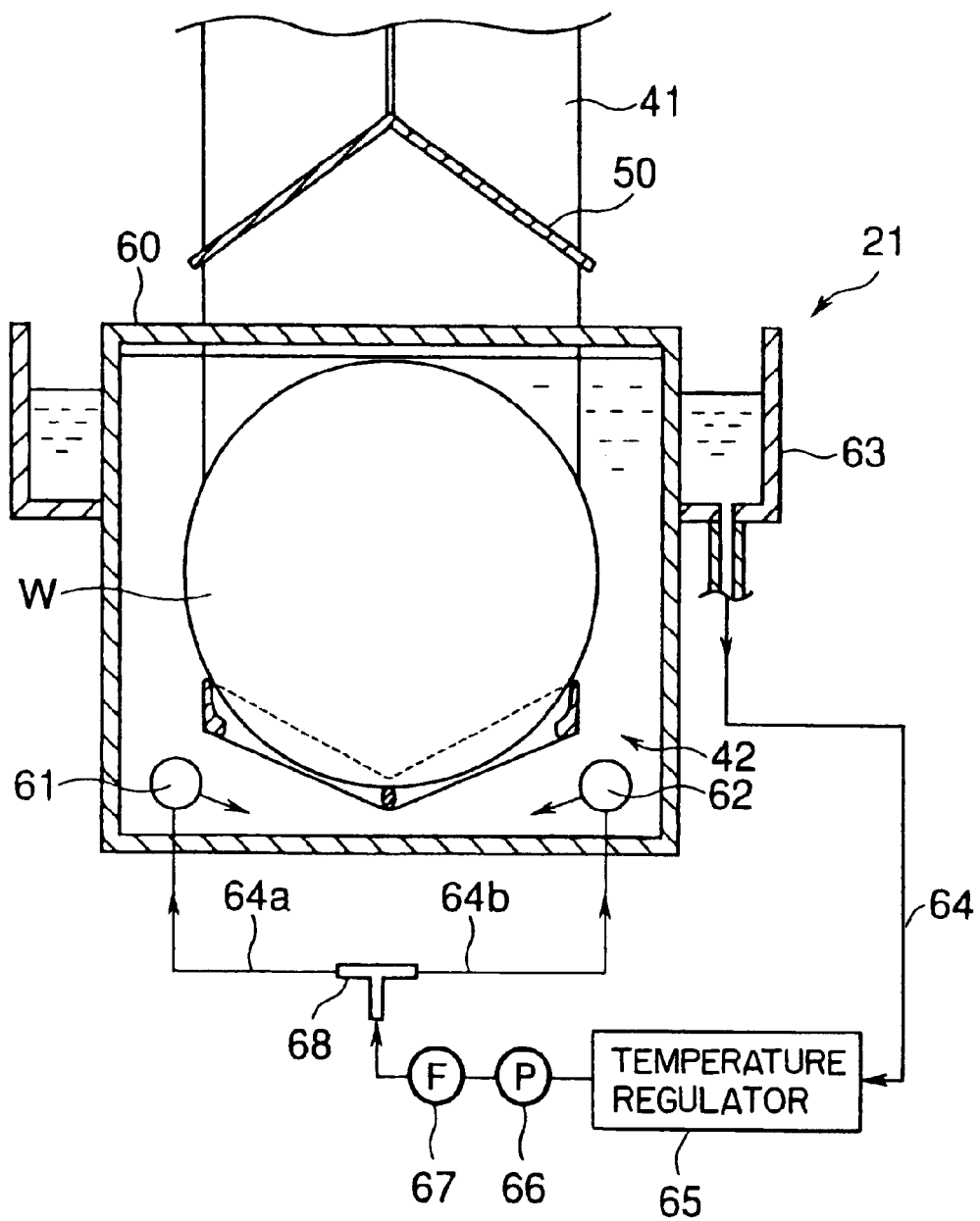
FIG. 8 is a sectional view of a chemical liquid tank included in the liquid processing unit shown in FIG. 3.

As shown in FIG. 8, the second chemical liquid tank 21 for etching has an open upper end covered with a shutter 60 capable of being opened and closed. Two chemical liquid supply pipes 61 and 62 are extended perpendicularly to the paper in a bottom region in the second chemical liquid tank 21. A chemical liquid, such as a dilute hydrofluoric acid solution, is spouted obliquely downward through a plurality of nozzle holes formed in the chemical liquid supply pipes 61 and 62 into the second chemical liquid tank 21. When using the second chemical liquid tank 21 for cleaning, the second chemical liquid tank 21 is filled up with a chemical liquid. An overflow tank 63 is disposed so as to surround an upper portion of the second chemical liquid tank 21. A circulating pipe 64 is connected to the bottom of the overflow tank 63. A temperature regulator 65, a pump 66 and a filter 67 are arranged in that order with respect to the flowing direction of the chemical liquid on the circulating pipe 64. The circulating pipe 64 is branched into branch pipes 64a and 64b connected, respectively, to the chemical liquid supply pipes 61 and 62. The chemical liquid overflowed the second chemical liquid tank 21 into the overflow tank 63 is returned through the pipes 64, 64a and 64b into the second chemical liquid tank 21. When the temperature regulator 65, the pump 66 and the filter 67 are thus arranged, the temperature regulator 65 is not affected adversely by the liquid pumped by the pump 66 and hence any damper does not need to be disposed below the pump 66.

Figure 9A:
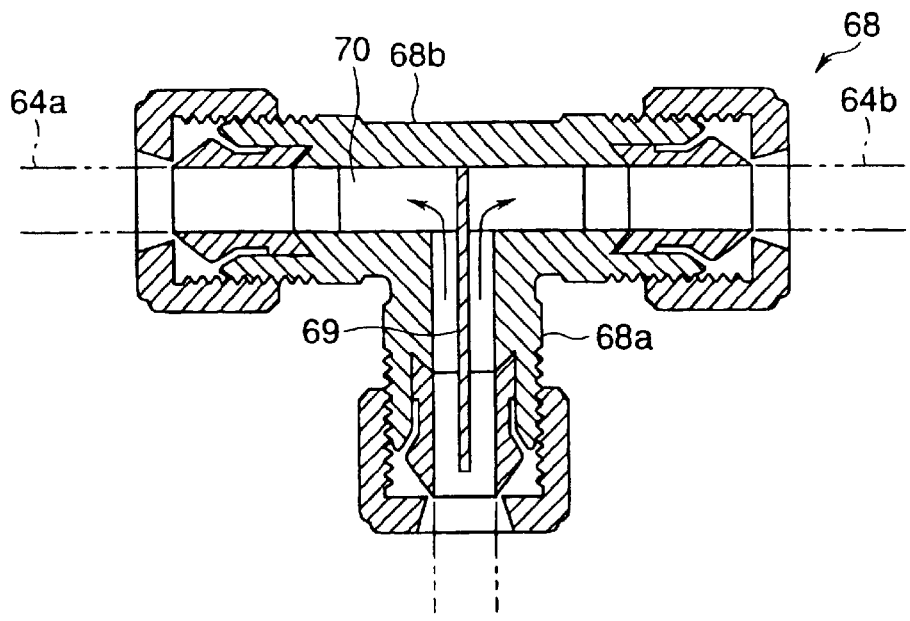
FIG. 9A is a sectional view of a pipe coupling placed in a chemical liquid circulating line connected to the chemical liquid tank shown in FIG. 8.
Figure 9B:
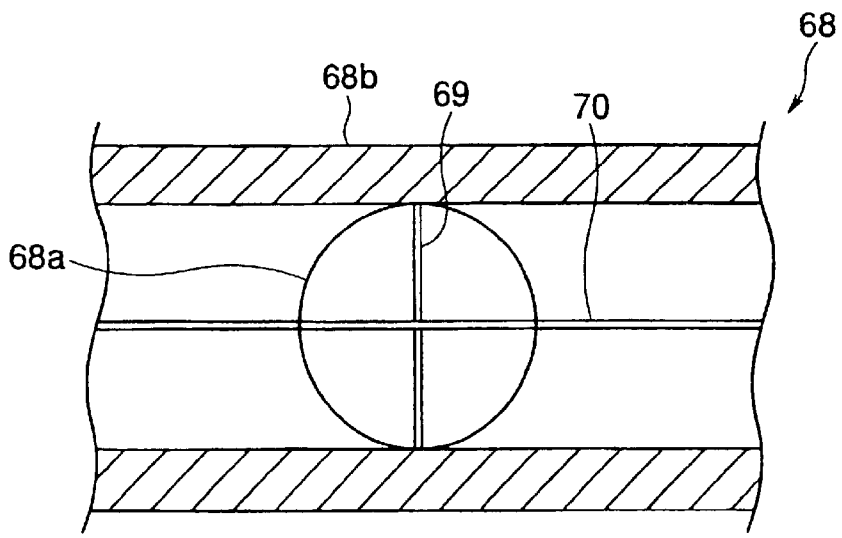
FIG. 9B is a sectional view taken on line IX—IX in FIG. 9A.
Figure 9C:
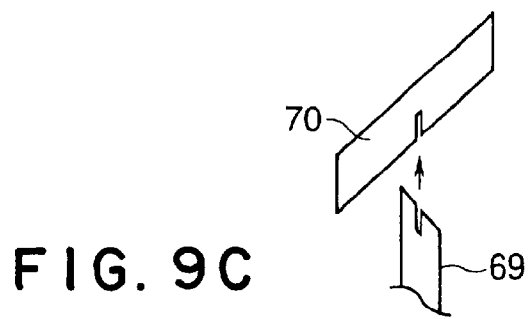
FIG. 9C is a perspective view of a combination of a partition plate and a support plate shown in FIG. 9B.

The pipe 64 and the branch pipes 64a and 64b are connected to a pipe coupling 68. As shown in FIGS. 9A and 9B, the pipe coupling 68 is a T-shaped structure formed by connecting a first coupling part 68a to which the pipe 64 is connected to a middle portion of a second coupling part 68b to which the branch pipes 64a and 64b are connected. A partition plate 69 for dividing the flow of the liquid flowed through the pipe 64 into the first coupling part 68a into two streams that flow into the branch pipes 64a and 64b, respectively. A support plate 70 as shown in FIG. 9C is placed in the second coupling part 68b to support the partition plate 69. The partition plate 69 prevents bubbles formed in the pipe 64 from joining together in large bubbles in the pipe coupling 68, disperses bubbles and prevents the damaging of wafers and the reduction of cleaning effect by large bubbles. The chemical liquid can be supplied at substantially the same rate through the chemical liquid supply pipes 61 and 62 into the second chemical liquid tank 21. The other tanks are substantially the same in construction as the second chemical liquid tank 21.

As shown in FIG. 2, the drying unit 6 has a rinsing tank 25. A dryer, not shown, defining a drying chamber is disposed above the rinsing tank 25. A vapor of, for example, isopropyl alcohol (IPA) is supplied into the drying chamber to dry wafers. A carrying device 26 carries wafers W between the rinsing tank 25 and the drying chamber. Wafers W rinsed with water in the rinsing tank 25 are carried into the drying chamber by the carrying device 26 and are subjected to IPA drying using a vapor of IPA. The carrying device 26 is similar to the carrying devices 23 and 24, except that the carrying device 26 is unable to move horizontally. Wafers W are transferred between the carrying device 26 and the carrying arm 17. In FIG. 2, indicated at 27 is a cleaning mechanism for cleaning the wafer holder of the carrying device 26.

The operation of the liquid processing apparatus 1 will be described hereinafter.

The moving table 15 carries a carrier C delivered onto the receiving stage 11 of the delivery station 2 to the wafer arranging device 14 installed on the stage 13. The wafer arranging device 14 arranges a plurality of wafers W, for example, fifty-two wafers, taken out of two carriers C in a row at a pitch equal to half a pitch at which the wafers W are arranged in the carriers C.

The wafers W thus arranged are supported on the support bars 17a and 17b of the carrying arm 17. The carrying arm 17 supporting the wafers W travels along the guide 29 to the processing and drying station 4. In the liquid processing unit 5, the wafers W are transferred from the carrying arm 17 to the wafer holder 32 of the first carrying device 23. Then, the wafer holding unit 31 is lowered to immerse the wafers W in an ammonia water contained in the first chemical liquid tank 19 to remove particles from the surfaces of the wafers W.

Subsequently, the wafer holding unit 31 is raised and is moved horizontally to a position above the first rinsing tank 20. Then, the wafer holding unit 31 is lowered to rinse the wafers W held on the wafer holder 32 with pure water contained in the rinsing tank 20 by an overflow rinsing method. After the wafers W have been rinsed, the wafer holding unit 31 is raised to take out the wafers W from rinsing tank 20, and then the wafers W are transferred from the wafer holder 32 onto the support bars 17a and 17b of the carrying arm 17.

Then, the carrying arm 17 moves to a position corresponding to the second chemical liquid tank 21 and transfers the wafers W to the wafer holder 42 of the second carrying device 24. When transferring the wafers W from the carrying arm 17 to the wafer holder 42 of the second carrying device 24, the cover 50 is retracted to an upper position so that the cover 50 may not obstruct a wafer transferring operation. In this stage, the carrying unit 41 is lowered to immerse the wafers W in an etch solution, such as a dilute hydrofluoric acid solution, contained in the second chemical liquid tank 21. Oxide films, such as $SiO_2$ films, respectively formed on the surfaces of the wafers W are etched by an etching process to reduce the thickness of the oxide films. During the etching process, the cover 50 is held above the second chemical liquid tank 21 as shown in FIG. 8.

Figure 10A:
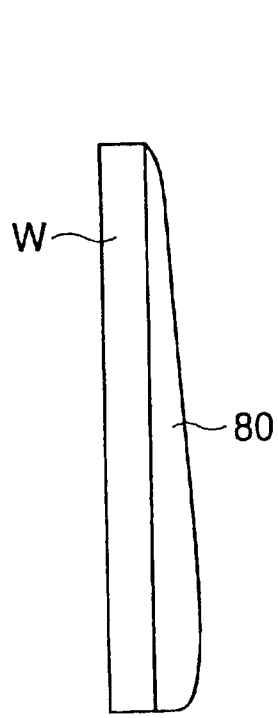
FIG. 10A is a typical sectional view of a wafer wetted with an etch solution and not exposed to a downflow of air.
Figure 10B:
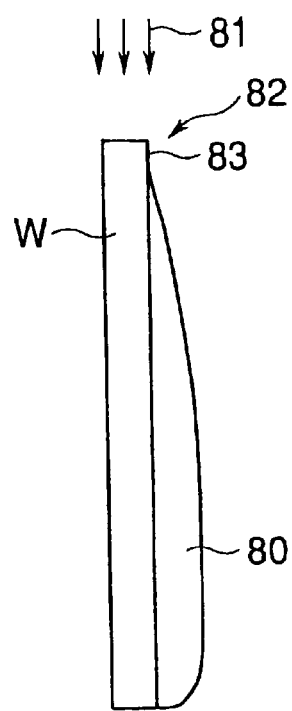
FIG. 10B is a typical sectional view of a wafer wetted with an etch solution and exposed to a downflow of air.

After the completion of the etching process, the wafer holding unit 41 is moved upward to raise the wafers W out of the etch solution contained in the second chemical liquid tank 21. While the wafers W are being thus raised out of the etch solution, the wafers W are wet with the etch solution and etching keeps progressing. At time immediately after the wafers W have been pulled out of the chemical liquid tank 21, an etch solution layer 80 formed on each wafer W have a thin upper portion and a thick lower portion as shown in FIG. 10A due to the effect of gravity. If the wafer W is not covered with the cover 50, the etch solution layer 80 is biased downward as shown in FIG. 10B by the effect of the downflow 81 of air. Even if the effect of the downflow of air is nullified by the technique mentioned in JP-A No. Hei 10-92790, the etch solution wetting the wafer W is biased downward by the effect of air currents 82 that are produced as the wafer W is raised and an upper portion 83 of the wafer W is wetted scarcely with the etch solution. Consequently, the etching of the upper portion 83 of the wafer W is stopped while other portions of the wafer W are still etched, and the oxide film is etched irregularly.

Figure 11A:
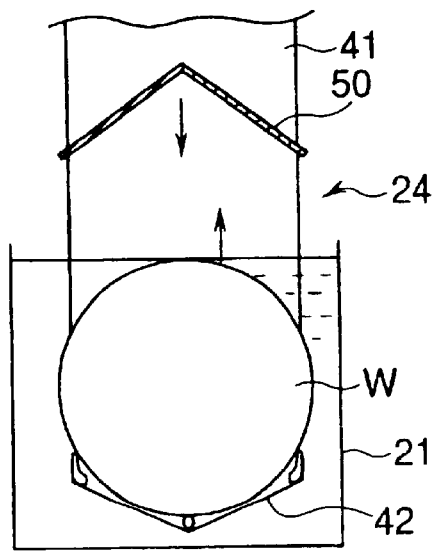
FIG. 11A is a typical sectional view showing a cover being lowered to a position where the cover is able to cover a space extending over wafers before raising the wafers out of a chemical liquid tank.
Figure 11B:
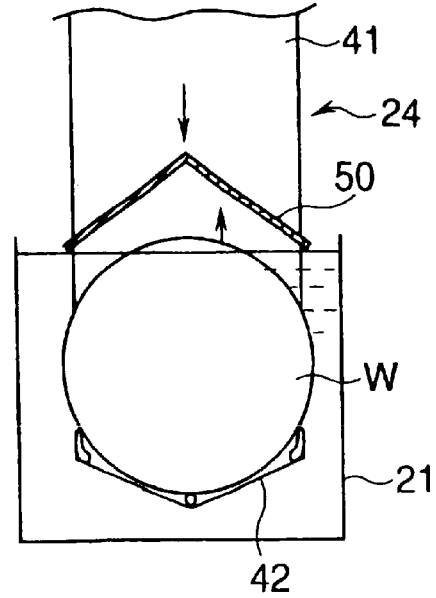
FIG. 11B is a typical sectional view showing wafers being raised out of a chemical liquid tank after a cover has been lowered to a position where the cover is able to cover a space extending over the wafers.
Figure 12:
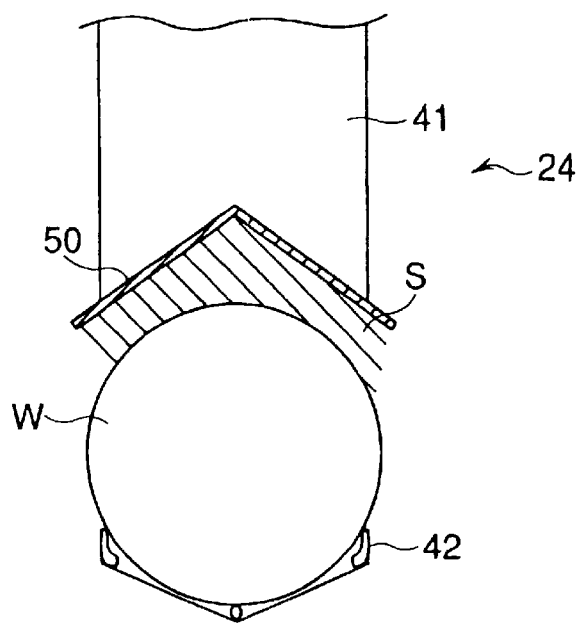
FIG. 12 is a typical view of assistance in explaining a region screened by a cover from the effect of air currents.

The liquid processing apparatus of the present invention lowers the cover 50 immediately before the start of raising the wafers W by the carrying device 24 as shown in FIG. 11A. At the start of the emergence of the wafers W from the surface of the etch solution, the cover 50 covers a space extending over the wafers W as shown in FIG. 11B. Then, the wafer holding unit 41 is raised with the wafers W and the cover 50 kept in the positional relation shown in FIG. 11B. Since the cover 50 covers a space S extending over the wafers W as shown in FIG. 12 so that any air currents are substantially not produced in the space S and the space S moves up together with the wafers W. Therefore, the wafers W are not exposed to the downflow of air and any air currents, the etch solution wetting the wafers W is not biased downward and, consequently, etching progresses uniformly over the entire surfaces of the wafers W. When the cover 50 is lowered to a predetermined position above the wafers W at the moment when the wafers W start emerging from the surface of the etch solution, the exposure of the wafers W to the effect of air currents can be prevented upon the emergence of the wafers W from the surface of the etch solution. After the wafers W have been pulled out of the etch solution by raising the wafer holding unit 41, the wafer holding unit 41 is moved horizontally to a position directly above the second rinsing tank 22, the wafer holding unit 41 is lowered to immerse the wafers W held on the wafer holder 42 in pure water contained in the second rinsing tank 22 for overflow rinsing to complete the etching process.

The cover 50 was tested for effect on etch uniformity through experiments. Wafers each provided with a SiO$_2$ film were immersed in a dilute hydrofluoric acid solution for a testing time. Then, the wafers were taken out of the dilute hydrofluoric acid solution and were rinsed with water. Etched thickness of the SiO$_2$ films was measured. Measured results are shown in Table 1.

TABLE 1

| Etched thickness (nm) | Without cover | With cover |
| --- | --- | --- |
| Mean | 15.85 | 16.01 |
| Maximum | 16.14 | 16.16 |
| Minimum | 14.74 | 15.71 |
| Standard deviation | 0.40 | 0.11 |
| 3σ/Mean (%) | 7.5 | 2.1 |

Figure 13:
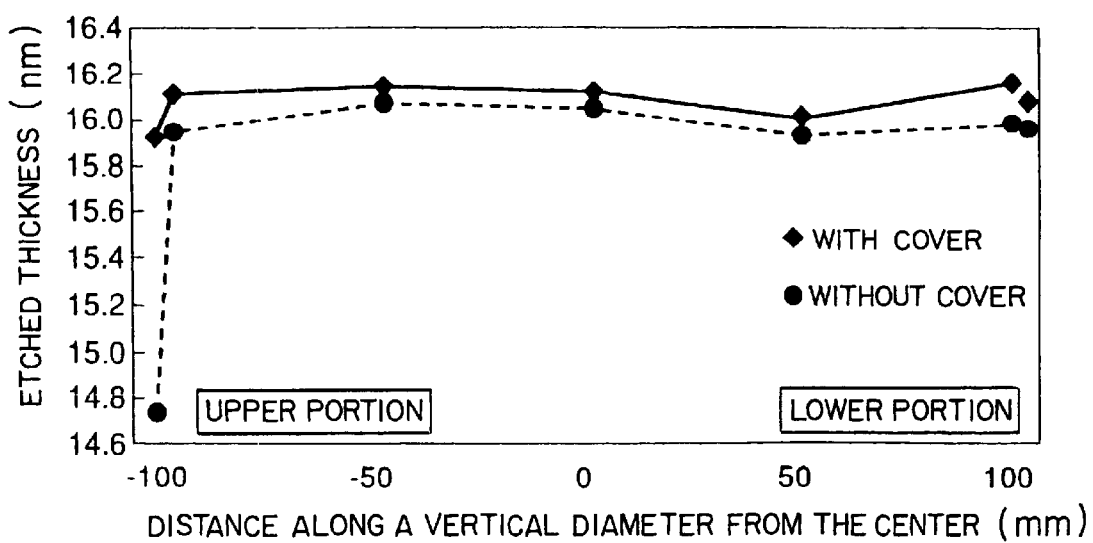
FIG. 13 is a graph of assistance in explaining the effects of the present invention.

As obvious from Table 1, values of etched thickness of the SiO$_2$ film are distributed in a wide range when the cover is not used and the value of etched thickness is extremely small in an upper end portion of the wafer W as shown in FIG. 13. When the cover is used, values of etched thickness is distributed in a narrow range and none of the tested wafers W had an upper end portion where the value of etched thickness was extremely small. The results of experiments proved the satisfactory effect of the cover 50 on achieving uniform etching.

After the completion of the etching process, the wafers W are transferred from the wafer holder 42 of the second carrying device 24 to the support bars 17a and 17b of the carrying arm 17. The carrying arm 17 holding the wafers W travels along the guide 29 to the drying unit 6 and transfers the wafers W to the carrying device 26 of the drying unit 6. In the drying unit 6, the wafers are rinsed with pure water contained in the rinsing tank 25 and the wafers W are pulled out of the rinsing tank 25. The wafers W held on the carrying device 26 in the drying chamber is exposed to an IPA vapor to replace water wetting the wafers W with IPA for drying.

After a drying process has been completed in the drying unit 6, the wafers W are transferred from the carrying device 26 to the support bars 17a and 17b of the carrying arm 17. The carrying arm 17 holding the wafers W travels along the guide 29 to a position corresponding to the stage 13 of the delivery station 2 and transfers the wafers W to the wafer arranging device 14. The wafer arranging device 14 rearranges the wafers W at the pitch at which the wafers W are contained in carriers C, and puts the predetermined number of wafers W, for example, twenty-six wafers W in each of two carriers C. The moving table 15 carries the carriers C to the delivery stage 12. The carriers C are delivered from the delivery stage 12 to the next process to complete the series of processes.

The present invention is not limited in its practical application to the foregoing embodiment and various changes are possible therein. For example, although the wafer holding unit of the carrying device provided with the cover receives the wafers from the carrying arm and immerses the wafers in a chemical liquid or pure water in the foregoing embodiment, the liquid processing apparatus may be provided with a carrying device as shown in FIG. 14 capable of receiving wafers at the delivery station, of traveling along the guide to carry the wafers sequentially to the tanks and of immersing the wafers in the processing liquids contained in the tanks.

Figure 14:
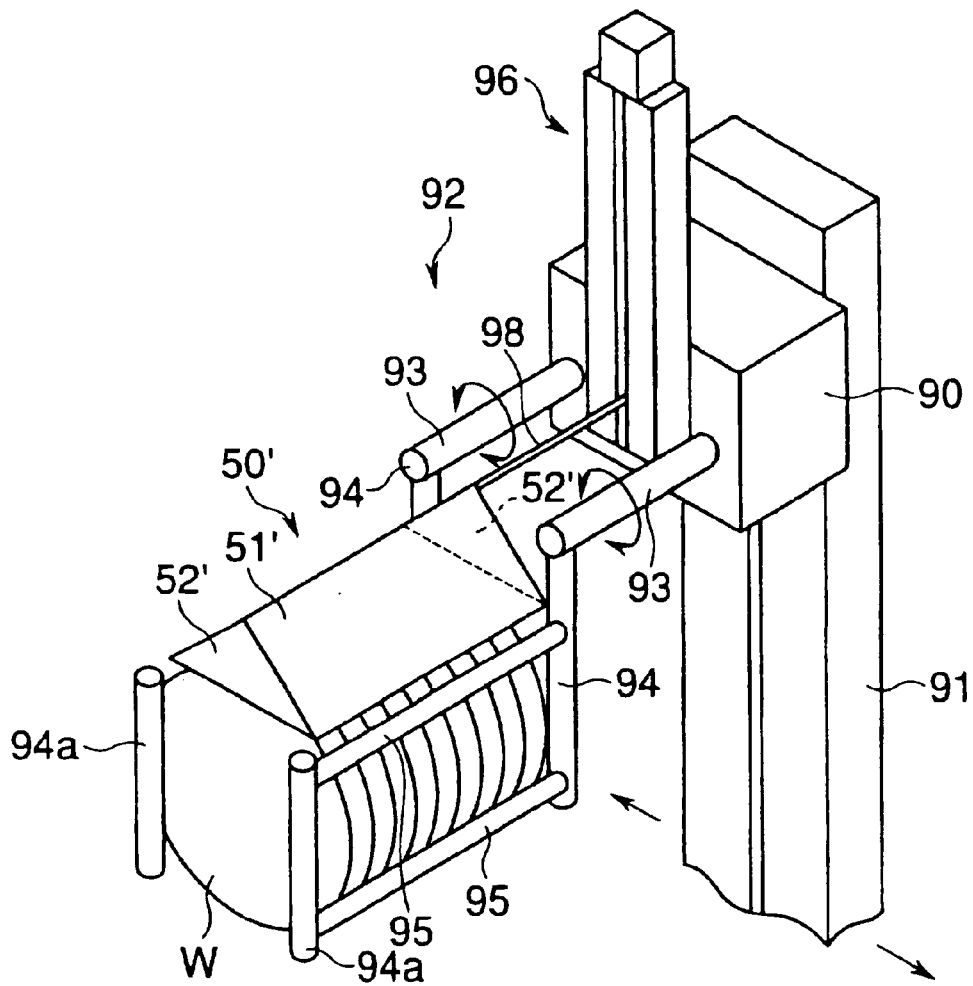
FIG. 14 is a perspective view of a carrying device provided with a cover in an another embodiment according to the present invention.

Referring to FIG. 14, a wafer holding unit 92 for holding wafers W is supported on a support member 90. The support member 90 is moved vertically by a vertical moving mechanism 91. The vertical moving mechanism 91 is capable of horizontally moving along a guide, not shown. The holding device 92 supported on the support member 90 has a pair of rotating rods 94 projecting from the support member 90, a pair of arms 94 extending vertically downward from the pair of rotating rods 93, two wafer holding bars 95 horizontally extending from each of the arms 94, and connecting bars 94a each connected to the free ends of the two holding bars 95. A lifting mechanism 96 including a ball screw is attached to the support member 90. A cover 50' is supported by a support bar 98 on the lifting mechanism 96. The cover 50' is moved vertically by the lifting mechanism 96. The cover 50' has a roof-shaped roofing member 51', and a pair of end covering members 52' attached to the roofing member 51 so as to cover the opposite longitudinal ends of the roofing member 51'. When pulling wafers W out of a chemical liquid tank, the cover 50' covers a space extending over the wafers W so that any air currents may not be generated in the space uniform etching may be achieved.

Although the foregoing covers have the roof-shaped roofing members, a roofing member of any shape may be employed provided that the roofing member is capable of covering the space extending over the wafers so that any air currents may not be generated. For example, the present invention may employ a semicylindrical roofing member 51a shown in FIG. 15A or a box-shaped roofing member 51B.

Although the present invention has been described as applied to an etching process, the present invention is applicable to other liquid processes. The present invention is applicable to processing substrates other than semiconductor wafers, such as substrates for liquid crystal displays.

As is apparent from the foregoing description, according to the present invention, the space extending over the wafers held by the wafer holder of a wafer carrying device is covered with the cover so that any air currents may not be generated in the same space. Therefore, the processing liquid wetting the wafers is not biased downward when pulling the liquid-processed wafers from the processing liquid by air currents that may be otherwise generated when the wafers are pulled out of the processing liquid and hence irregular processing can be prevented.

What is claimed is:

1. A liquid processing apparatus comprising:
   a processing bath processing a plurality of substrates by a processing liquid;
   a substrate holding device having a substrate holding member capable of holding the plurality of substrates in a vertical position, the substrate holding device being capable of carrying the substrates between the processing bath and an upper position above the processing bath; and a cover placed in a space extending over the substrates held by the substrate holding member of the substrate holding device, the cover covering the space so that any air currents may not be substantially generated around the substrates, the cover having a roofing member extending circumferentially in an upper space of the substrates held by the substrate holding member and end covering members provided in the roofing member, the end covering members being positioned in opposite sides of an axial direction of a row of the substrates and in the upper space of the substrates.

2. The liquid processing apparatus according to claim 1, wherein the processing bath contains the processing liquid, the substrates being immersed in the processing liquid to process the substrate, and the substrate holding device carries the substrates between a processing position where the substrates are immersed in the processing liquid in the processing bath and the upper position.

3. The liquid processing apparatus according to claim 1, wherein the liquid processing is etching oxidized film formed on the substrates.

4. The liquid processing apparatus according to claim 1, wherein the cover is formed in a semicylindrical shape by a combination of the roofing member and the end covering members.

5. The liquid processing apparatus according to claim 1 wherein the cover is formed in a shape of a box by a combination of the roofing member and the end covering members.

6. The liquid processing apparatus according to claim 1 wherein a lower end of the cover is on a level not higher than upper ends of the substrates.

7. The liquid processing apparatus according to claim 1 wherein the cover is supported movably upwardly and downwardly against the substrates.

8. The liquid processing apparatus according to claim 1 wherein the substrate holding device is also capable of carrying the substrates between the processing bath and a position beside the processing bath.

9. The liquid processing apparatus according to claim 1 wherein the substrate holding device includes a pair of support bars capable of substantially horizontally moving toward and away from each other in order to hold the substrates therebetween.

* * * * *